United States Patent
Bettridge et al.

(10) Patent No.: US 7,226,353 B2
(45) Date of Patent: Jun. 5, 2007

(54) CABINET FOR COMPUTER DEVICES WITH AIR DISTRIBUTION DEVICE

(75) Inventors: James M. Bettridge, Merrillville, IN (US); Thomas K. Ford, Northbrook, IL (US); James R. Turek, Schaumburg, IL (US)

(73) Assignee: Power of 4, LLC, Lake St. Louis, MO (US)

( * ) Notice: Subject to any disclaimer, the term of this patent is extended or adjusted under 35 U.S.C. 154(b) by 45 days.

(21) Appl. No.: 11/181,494

(22) Filed: Jul. 14, 2005

(65) Prior Publication Data

US 2005/0248043 A1    Nov. 10, 2005

Related U.S. Application Data

(63) Continuation of application No. 10/756,820, filed on Jan. 13, 2004, now Pat. No. 7,074,123.

(51) Int. Cl.
*H05K 5/00* (2006.01)
(52) U.S. Cl. .................. 454/184; 361/695; 361/696
(58) Field of Classification Search ............... 454/184, 454/185, 195; 361/695, 696
See application file for complete search history.

(56) References Cited

U.S. PATENT DOCUMENTS

| | | | |
|---|---|---|---|
| 2,596,909 A | | 5/1952 | Mufich et al. |
| 3,120,166 A | * | 2/1964 | Lyman ..................... 454/307 |
| 4,158,875 A | | 6/1979 | Tajima et al. |
| 4,261,519 A | | 4/1981 | Ester |
| 4,352,274 A | | 10/1982 | Anderson et al. |

(Continued)

FOREIGN PATENT DOCUMENTS

DE    25 37 295 A1    4/1976

(Continued)

OTHER PUBLICATIONS

*Spinazzola, *High delta cooling* (*HDTC*, U.S. Patent 6,412,292; 6,494,050; 6,574,970; 6,577,357, other patents pending ) *provides increased energy efficiency and reliability for data centers*, 2001, 12 pages, RTKL Associates Inc., Baltimore, Maryland.

(Continued)

*Primary Examiner*—Derek S. Boles
(74) *Attorney, Agent, or Firm*—McDermott Will & Emery LLP (57) ABSTRACT

A cabinet for housing computer devices with an internal air distribution system is disclosed. The cabinet includes an internal chamber defined by a side wall arrangement having at least a front wall. The cabinet includes a support structure for computer devices, wherein the support structure is positioned within the internal chamber of the cabinet. The air distribution device comprises an elongated duct defining a passageway for air distribution. The duct is positioned within the internal chamber and has at least one adjustable air discharge port that is in fluid communication with the passageway. The air distribution device further includes an inlet fan in fluid communication with the passageway. By precisely directing cool air to a frontal portion of the computer devices, the air distribution device reduces the temperature gradients within the cabinet and the quantity of heat that accumulates in the cabinet during operation of the computer devices.

25 Claims, 9 Drawing Sheets

U.S. PATENT DOCUMENTS

| | | | |
|---|---|---|---|
| 4,434,625 A | 3/1984 | Cree | |
| 4,710,096 A | 12/1987 | Erlam | |
| 4,774,631 A | 9/1988 | Okuyama et al. | |
| 4,832,717 A | 5/1989 | Peters | |
| 4,851,965 A | 7/1989 | Gabuzda et al. | |
| 5,136,465 A | 8/1992 | Benck et al. | |
| 5,285,347 A | 2/1994 | Fox et al. | |
| 5,349,823 A | 9/1994 | Solomon | |
| 5,428,503 A | 6/1995 | Matsushima et al. | |
| 5,460,441 A * | 10/1995 | Hastings et al. | 312/298 |
| 5,505,533 A | 4/1996 | Kammersqard et al. | |
| 5,544,012 A * | 8/1996 | Koike | 361/695 |
| 5,583,746 A | 12/1996 | Wang | |
| 5,621,613 A | 4/1997 | Haley et al. | |
| 5,657,641 A | 8/1997 | Cunningham et al. | |
| 5,671,805 A | 9/1997 | Ståhl et al. | |
| 5,684,674 A | 11/1997 | Yin | |
| 5,706,668 A | 1/1998 | Hilpert | |
| 5,718,628 A | 2/1998 | Nakazato et al. | |
| 5,731,954 A | 3/1998 | Cheon | |
| 5,757,615 A | 5/1998 | Donahoe et al. | |
| 5,813,243 A | 9/1998 | Johnson et al. | |
| 5,823,005 A | 10/1998 | Alexander et al. | |
| 5,851,143 A * | 12/1998 | Hamid | 454/57 |
| 5,927,094 A | 7/1999 | Nickum | |
| 5,927,385 A | 7/1999 | Yeh | |
| 5,931,002 A | 8/1999 | Nagashima | |
| 5,949,646 A | 9/1999 | Lee et al. | |
| 5,970,731 A | 10/1999 | Hare et al. | |
| 5,987,890 A | 11/1999 | Chiu et al. | |
| 6,011,688 A | 1/2000 | Thornburg et al. | |
| 6,038,128 A | 3/2000 | Hood, III et al. | |
| 6,052,282 A | 4/2000 | Sugiyama et al. | |
| 6,088,225 A | 7/2000 | Parry et al. | |
| 6,094,345 A | 7/2000 | Diemunsch | |
| 6,108,203 A | 8/2000 | Dittus et al. | |
| 6,109,039 A | 8/2000 | Hougham et al. | |
| 6,118,655 A | 9/2000 | Mecredy, III et al. | |
| 6,141,213 A | 10/2000 | Antonuccio et al. | |
| 6,145,586 A | 11/2000 | Lo | |
| 6,164,369 A | 12/2000 | Stoller | |
| 6,166,907 A | 12/2000 | Chien | |
| 6,167,947 B1 | 1/2001 | Hokanson et al. | |
| 6,181,556 B1 | 1/2001 | Allman | |
| 6,186,890 B1 * | 2/2001 | French et al. | 454/184 |
| 6,196,003 B1 | 3/2001 | Macias et al. | |
| 6,198,628 B1 * | 3/2001 | Smith | 361/695 |
| 6,210,267 B1 | 4/2001 | Long et al. | |
| 6,213,194 B1 | 4/2001 | Chrysler et al. | |
| 6,226,178 B1 | 5/2001 | Broder et al. | |
| 6,234,240 B1 | 5/2001 | Cheon | |
| 6,294,762 B1 | 9/2001 | Faries et al. | |
| 6,309,296 B1 | 10/2001 | Schwenk et al. | |
| 6,374,627 B1 | 4/2002 | Schumacher et al. | |
| 6,385,046 B1 | 5/2002 | Ta et al. | |
| 6,407,916 B1 | 6/2002 | Konstad | |
| 6,408,630 B2 | 6/2002 | Macias et al. | |
| 6,412,292 B2 | 7/2002 | Spinazzola et al. | |
| 6,462,944 B1 | 10/2002 | Lin | |
| 6,493,223 B1 | 12/2002 | Viswanath et al. | |
| 6,494,050 B2 | 12/2002 | Spinazzola et al. | |
| 6,496,366 B1 | 12/2002 | Coglitore et al. | |
| 6,515,857 B2 | 2/2003 | Ford et al. | |
| 6,525,935 B2 | 2/2003 | Casebolt | |
| 6,525,936 B2 * | 2/2003 | Beitelmal et al. | 361/695 |
| 6,535,382 B2 * | 3/2003 | Bishop et al. | 361/690 |
| 6,542,361 B2 | 4/2003 | Paradis | |
| 6,557,357 B2 | 5/2003 | Spinazzola et al. | |
| 6,565,428 B2 | 5/2003 | Hsiao | |
| 6,574,104 B2 | 6/2003 | Patel et al. | |
| 6,574,970 B2 | 6/2003 | Spinazzola et al. | |
| 6,614,657 B2 | 9/2003 | Searls et al. | |
| 6,616,524 B2 * | 9/2003 | Storck et al. | 454/184 |
| 6,628,520 B2 * | 9/2003 | Patel et al. | 361/696 |
| 6,652,374 B2 * | 11/2003 | Sharp et al. | 454/184 |
| 6,668,565 B1 | 12/2003 | Johnson et al. | |
| 6,807,056 B2 * | 10/2004 | Kondo et al. | 361/689 |
| 6,847,013 B2 * | 1/2005 | Audette et al. | 219/400 |
| 2001/0008071 A1 | 7/2001 | Macias et al. | |
| 2001/0029163 A1 | 10/2001 | Spinazzola et al. | |
| 2002/0007643 A1 | 1/2002 | Spinazzola et al. | |
| 2002/0008961 A1 | 1/2002 | Amaike et al. | |
| 2002/0059804 A1 | 5/2002 | Spinazzola et al. | |
| 2002/0075642 A1 | 6/2002 | Nagashima et al. | |
| 2002/0108386 A1 | 8/2002 | Spinazzola et al. | |
| 2002/0117291 A1 | 8/2002 | Cheon | |
| 2002/0118514 A1 | 8/2002 | Coglitore et al. | |
| 2002/0126449 A1 | 9/2002 | Casebolt | |
| 2002/0149911 A1 | 10/2002 | Bishop et al. | |
| 2002/0185262 A1 | 12/2002 | Baer | |
| 2002/0196604 A1 | 12/2002 | Lehman et al. | |
| 2003/0002251 A1 | 1/2003 | Grouell et al. | |
| 2003/0002254 A1 | 1/2003 | Faneuf et al. | |
| 2003/0011994 A1 | 1/2003 | Loebach | |
| 2003/0035264 A1 | 2/2003 | Hartel et al. | |
| 2003/0043542 A1 | 3/2003 | Monfarad | |
| 2003/0051859 A1 | 3/2003 | Chesser et al. | |
| 2003/0051860 A1 | 3/2003 | Montgomery et al. | |
| 2003/0053293 A1 | 3/2003 | Beitelmal et al. | |
| 2003/0067745 A1 | 4/2003 | Patel et al. | |
| 2003/0077998 A1 | 4/2003 | Sharp et al. | |
| 2003/0095381 A1 | 5/2003 | Lee et al. | |
| 2003/0110779 A1 | 6/2003 | Otey et al. | |
| 2003/0128511 A1 | 7/2003 | Nagashima et al. | |
| 2003/0128515 A1 | 7/2003 | Faneuf et al. | |
| 2003/0128516 A1 | 7/2003 | Faneuf et al. | |
| 2003/0128517 A1 | 7/2003 | Faneuf et al. | |
| 2003/0128525 A1 | 7/2003 | Berry et al. | |
| 2003/0147214 A1 | 8/2003 | Patel et al. | |
| 2003/0150231 A1 | 8/2003 | Spinazzola et al. | |

FOREIGN PATENT DOCUMENTS

| | | |
|---|---|---|
| DE | 33 16 978 A1 | 11/1984 |
| EP | 0 289 300 A2 | 11/1988 |
| FR | 2 819 115 A1 | 7/2002 |
| JP | 01 297892 A | 11/1989 |
| WO | WO 02/39024 A2 | 5/2002 |

OTHER PUBLICATIONS

*Liebert® Rack Cooler™*, 2001, 8 pages, Liebert Corporation, Columbus, Ohio.

*Liebert® XDA Air Flow Enhancer*, 2002, 2 pages, Liebert Corporation, Columbus, Ohio.

*Cooling Imperatives for Data Centers and Network Rooms*, 2003, 10 pages, American Power Conversion.

*Managing Extreme Heat Cooling Strategies for High-Density Computer Systems*, Jan. 28, 2003, 16 pages, Liebert Corporation, Columbus, Ohio.

*APW internet pages, Sep. 25, 2003, 9 pages, APW, Waukesha, Wisconsin.

*RTKL secures patent for method to cool computers*, Sep. 25, 2003, 2 pages, RTKL Associates Inc., Baltimore, Maryland.

*1U rack mount cluster chassis servers MyriNet clustering connectivity*, Sep. 25, 2003, 2 pages, Computer & Control Solutions Inc.

*Who is CCSI?*, Sep. 25, 2003, 2 pages, Computer & Control Solutions Inc.

*CCSI's Clusteron™ Cooling Technology*, Sep. 25, 2003, 2 pages, Computer & Control Solutions Inc.

*Knurr internet pages, Sep. 25, 2003, 7 pages, Knurr Inc.
*HPS Technologies Home Page, Sep. 25, 2003, 2 pages, HPS Technologies Limited, New Zealand.
*D.L. Custom internet pages, Nov. 25, 2003, 18 pages, D.L. Custom Ltd., Canada.

International Search Report for International Application No. PCT/US2005/000874, mailed Oct. 17, 2005, 5 pages, European Patent Office, Rijswijk, NL.

* cited by examiner

FIG. 11

CABINET FOR COMPUTER DEVICES WITH AIR DISTRIBUTION DEVICE

CROSS-REFERENCE TO RELATED APPLICATIONS

This application is a continuation of U.S. patent application Ser. No. 10/756,820, filed Jan. 13, 2004, U.S. Pat. No. 7,074,123 which application is incorporated herein by reference and made a part hereof.

FEDERALLY SPONSORED RESEARCH OR DEVELOPMENT

Not applicable.

TECHNICAL FIELD

The present invention relates to a cabinet for an arrangement of computer devices and having an internal air distribution device. More specifically, the present invention relates to a cabinet with an internal air distribution device that selectively delivers ambient room air to an arrangement of computer devices.

BACKGROUND OF THE INVENTION

Cabinets for a stack of computer devices are well-known in the computer accessory industry. Conventional cabinets are generally rectangular structures with an internal region that contains a rack for storing and supporting multiple computers. Typically, the rack has a multitude of slots that receive and support the computers or servers in a vertical arrangement. The majority of existing cabinets include at least one door that provides access to the interior of the cabinet, including the rack and the computers.

Existing cabinets suffer from a number of problems including the excessive build-up or accumulation of heat that is generated during operation of the computers. Since heat rises, an inordinate amount of heat is found at an upper portion of the cabinet during operation of the computers, while a lesser amount of heat is found at a lower portion of the cabinet. As a result, there is a temperature gradient within the cabinet, from the upper portion to the lower portion of the cabinet. In most cabinets, there is a temperature gradient along the face or front portion of the rack and the rear portion of the rack. It is well-recognized that heat is a major contributing factor to the failure of the computer components within the cabinet. Because a greater amount of heat is found at the upper portion of the cabinet, the computers positioned in the upper portion of the rack experience a greater failure rate than those positioned in the lower portion of the rack. Although computers in the upper portion of the cabinet tend to fail at a higher rate, the computers in the lower portion of the cabinet can fail, especially when a large amount of heat is present. To address these and other problems, a number of conventional cabinets include a cooling device intended to reduce the amount of heat that accumulates in the cabinet. However, the cooling devices of these cabinets do not provide a uniform flow of cooling air throughout the cabinet, thereby reducing the effectiveness of the device. In addition, these cooling devices create number of installation problems due to large dimensions and bulky configurations.

A conventional cabinet having a cooling device is marketed by the Liebert Corporation of Columbus, Ohio under the AirFlow Enhancer trade name. This cooling device is a large, external device that mounts to the outer surface of the rear door of the cabinet. Also, the device includes a number of fans that are designed to draw air through the front door of the cabinet, the rack and computers, and the rear door. Due its arrangement of fans, this device cannot provide cool air to specific locations within the cabinet and, as a result, does not address the temperature gradient explained above. In addition, this device has large dimensions which can negatively affect the positioning of the host cabinet and nearby cabinets. Another cabinet and cooling device marketed by Liebert Corp. and marketed under the RackCooler trade name suffers from similar problems. This cooling device is an external device with multiple fans that mounts to the rear door of the cabinet. Unlike the previous device, the RackCooler is a complex device that includes a cooling coil with a hose for attachment to a cooling unit. In addition to the limitations presented above, this device is costly and requires additional connections to the cooling unit.

U.S. Pat. No. 6,186,890 discloses a computer cabinet with an opening in a lower region of the cabinet and a vent in the top wall of the cabinet. Similarly, U.S. Pat. Nos. 6,557,357; 6,412,292; and, 6,574,970 each disclose a computer cabinet with an inlet opening in the bottom wall of the cabinet and a vent in the top wall of the cabinet. Collectively, these computer cabinets cannot uniformly distribute cool air within the cabinet to address the temperature gradient and, as a result, are not effective at addressing the issues identified above.

Therefore, there is a definite need for a cabinet with an air distribution device that precisely and selectively delivers cool ambient air to the computers within the rack to address the temperature gradient. In addition, there is a need for an affordable cabinet with an internal air distribution device that does not increase the footprint or exterior configuration of the cabinet.

The present invention is provided to solve these and other problems.

SUMMARY OF THE INVENTION

The present invention relates to a cabinet for housing computer devices or servers. The cabinet has an internal chamber with at least one air distribution device that draws in and selectively distributes ambient room air to a frontal region of the computer devices. In most installations, the cabinet is placed in an air conditioned environment, so the ambient air is cool air. The cabinet further includes an internal support structure or rack that supports the computer devices. The cabinet has an internal chamber that is defined by a side wall arrangement that includes a permeable front wall, a permeable rear wall, a first side wall, and a second side wall. Preferably, the front wall and/or the rear wall are doors that are hingeably connected to the cabinet.

In accord with the invention, the internal air distribution device includes an elongated duct, a plurality of discharge ports, an inlet fan, and a plenum. The duct defines a passageway for the distribution of air. The duct is positioned substantially vertical within the cabinet between the side wall arrangement and the support structure. The duct of the internal air distribution device includes at least one discharge port that is in fluid communication with the passageway and that transmits air from the passageway into the internal chamber. The discharge ports are preferably adjustable nozzles that can be selectively altered to control the volume and direction of the air flow. The nozzles are cooperatively positioned with the computer devices in the support structure to supply cool ambient air to a frontal region of the computer devices, including the front face and adjacent side portions of the devices. The inlet fan is in fluid communication with the passageway of the duct. The inlet fan is configured to draw in air from a lower region of the internal chamber of the cabinet. The inlet fan has an opening through which air is drawn and communicated to the passageway. The plenum is a region of the internal chamber from which air is drawn into the passageway by the inlet fan. A lower portion of the elongated duct extends into the plenum.

In further accord with the invention and in operation, the air distribution device draws ambient air into the cabinet and then distributes it to the frontal region of the computer devices arrayed in the support structure. Because the discharge ports are selectively adjustable, the air distribution device precisely distributes air to the computer devices. The air transmitted by the distribution device is drawn into the computer devices and as a result, the amount of heat that is generated by the devices and that remains within the internal chamber of the cavity is reduced. This causes a reduction in the temperature gradient within the cabinet.

In further accord with the invention, there is an enlarged cabinet with two distinct internal chambers. Each internal chamber has at least one air distribution device, and a side wall arrangement. Preferably, the enlarged cabinet has four air distribution devices; however, the assembly can have a greater or lesser number of distribution devices.

Other features and advantages of the invention will be apparent from the following specification taken in conjunction with the following drawings.

BRIEF DESCRIPTION OF THE DRAWINGS

To understand the present invention, it will now be described by way of example, with reference to the accompanying drawings in which.

DETAILED DESCRIPTION

While this invention is susceptible of embodiments in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiment illustrated.

Figure 1:
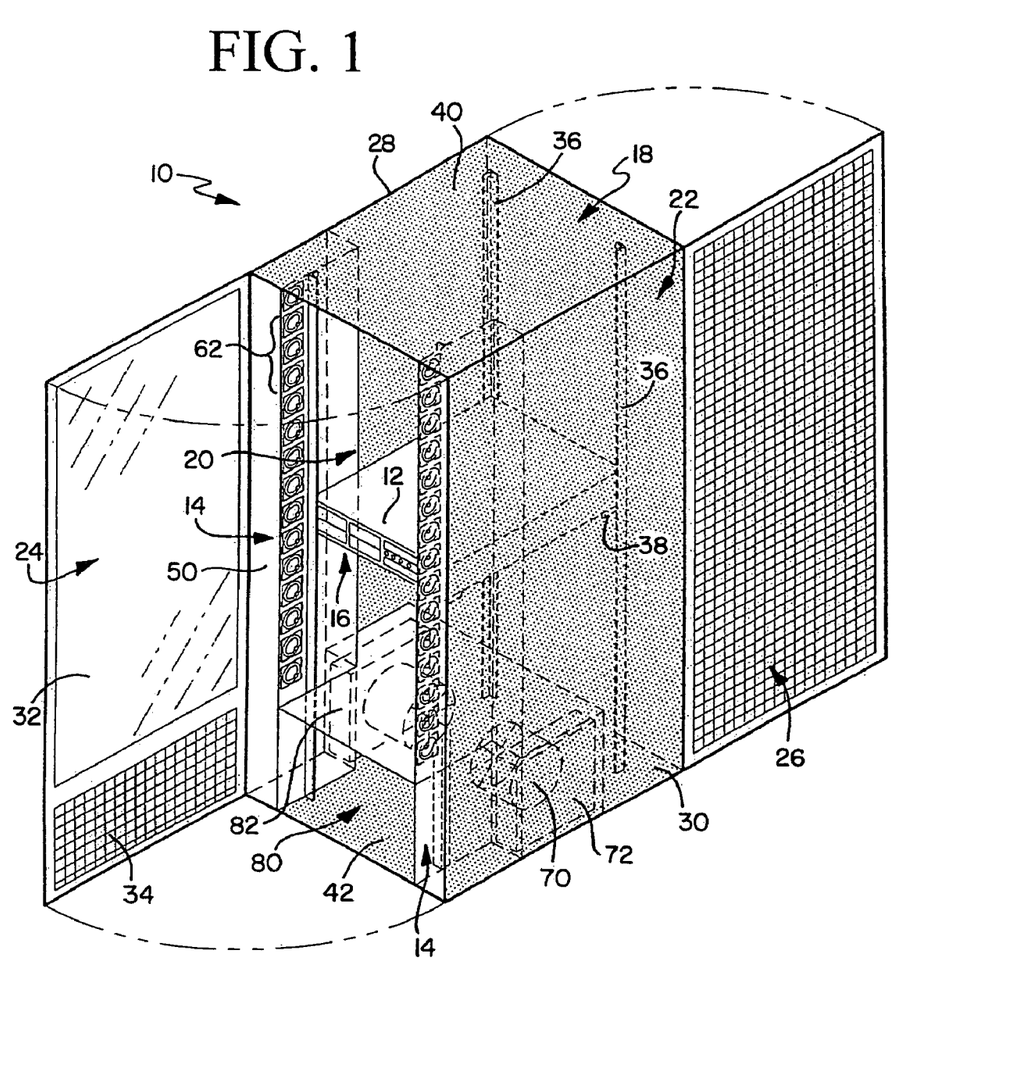
FIG. 1 is a perspective view of the cabinet of the present invention, showing an internal air distribution device and a support structure for a computer device.

Referring to FIG. 1, a cabinet 10 for housing computer devices or servers 12 is shown. The cabinet 10 has at least one internal air distribution device 14 that is configured to selectively distribute ambient air to a frontal portion 16 of the computer devices 12. In most installations, the cabinet 10 is placed in an air conditioned environment, such as an air conditioned data center, so the ambient air is generally cool air. The frontal portion 16 of the computer device 12 includes the front face and the front portion of the adjacent side walls of the device 12 . Although a single computer device 12 is shown in FIG. 1, it is understood that a plurality of computer devices 12 can be positioned within the cabinet 10. The cabinet 10 further includes an internal support structure or rack 18 that is adapted to support computer devices 12 in a substantially horizontal or stacked position.

Figure 2:
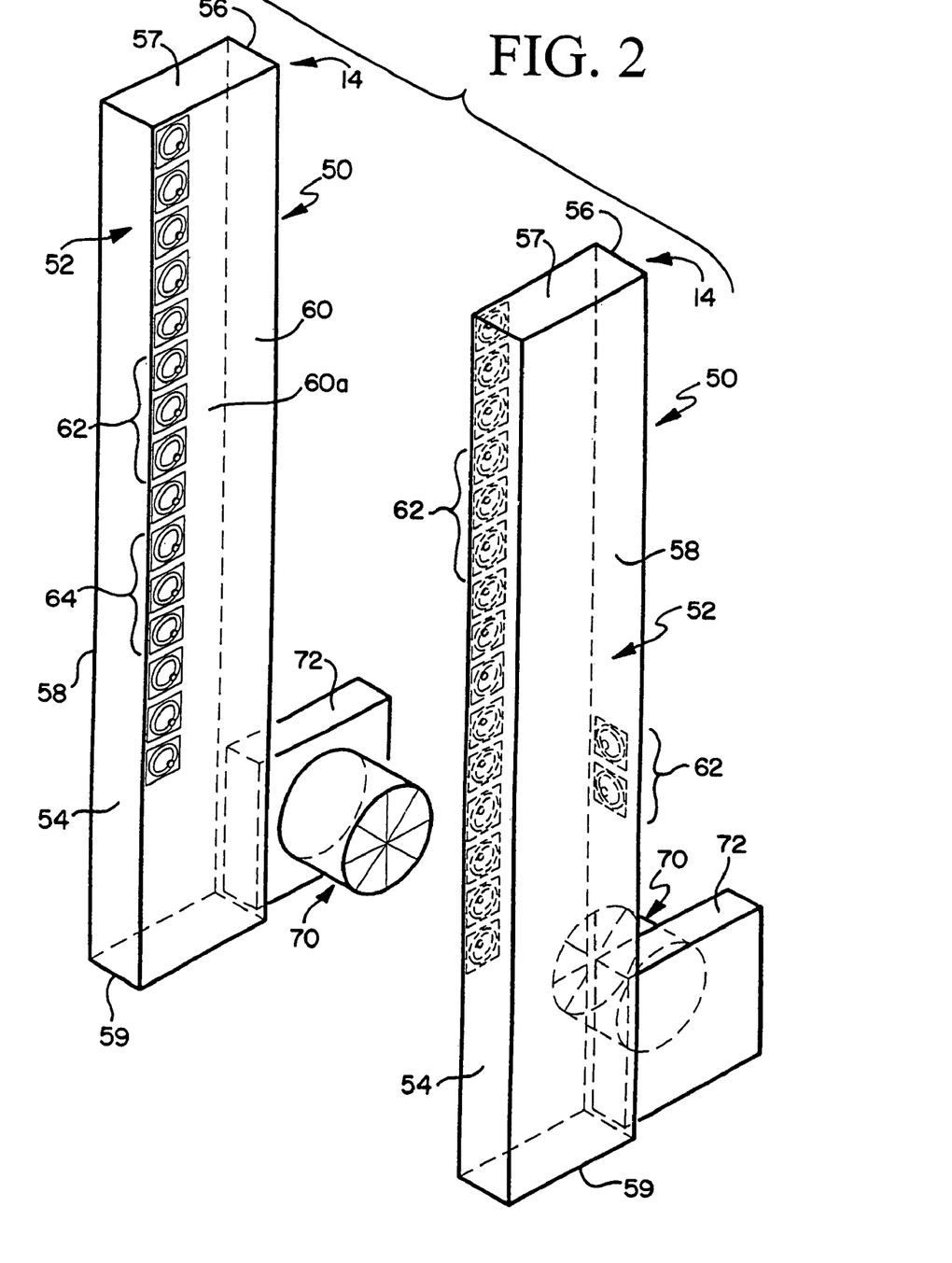
FIG. 2 is a perspective view of the present invention of FIG. 1, showing the air distribution device removed from the cabinet.
Figures 2A, 3:
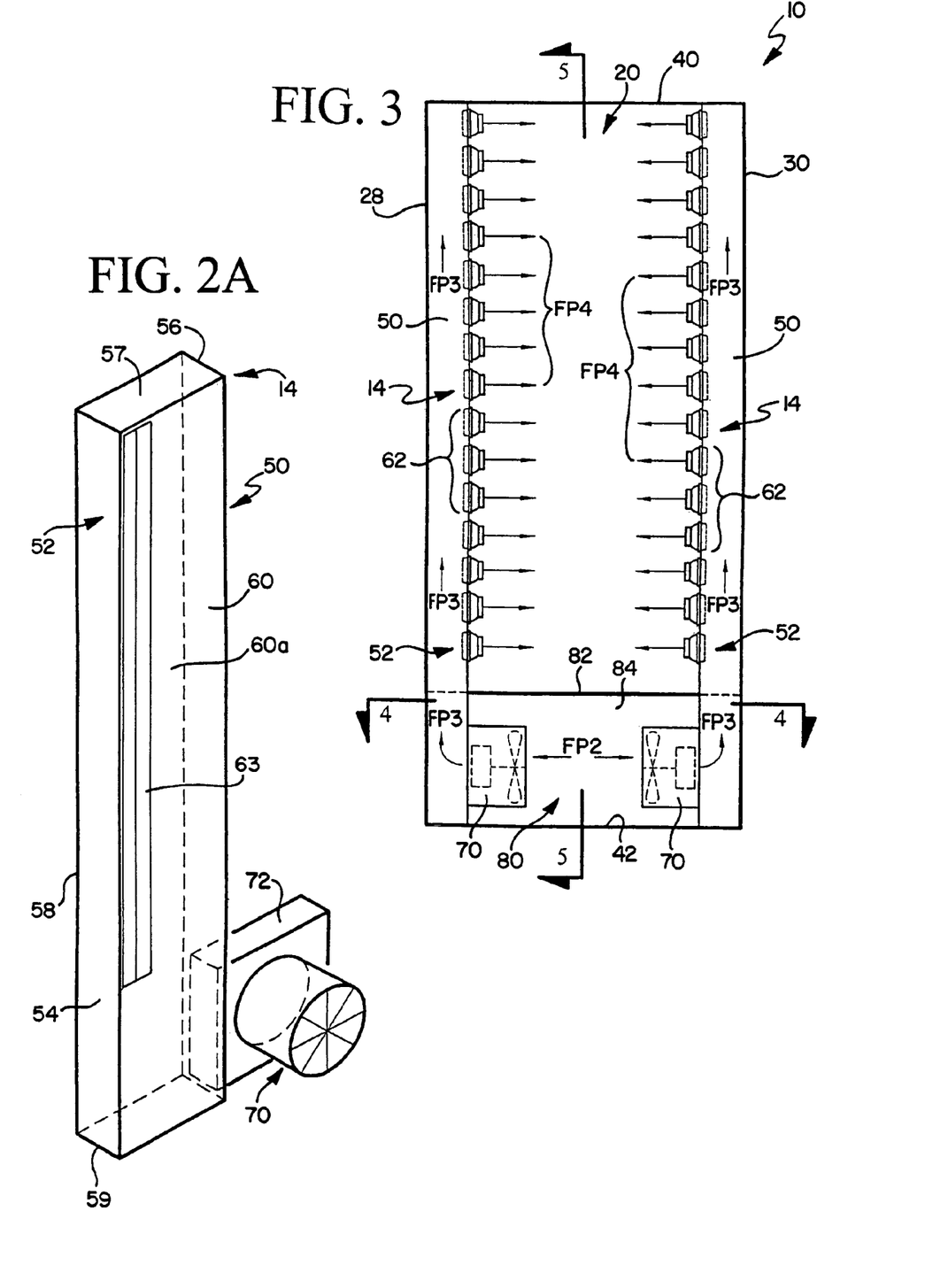
FIG. 2A is a perspective view of the present invention, showing an alternate air distribution device having an elongated slot.
FIG. 3 is a front plan view of the cabinet of FIG. 1, showing the air distribution device and a front wall of the cabinet being removed.
Figure 4:
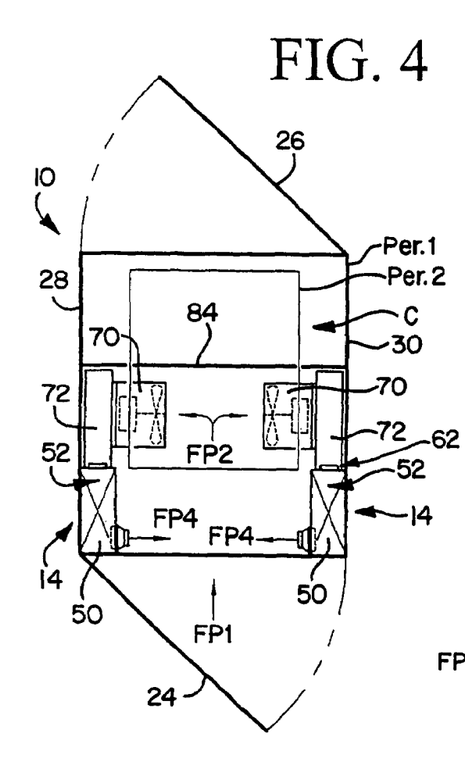
FIG. 4 is a top plan view of the cabinet of FIG. 1 taken along line 4-4 of FIG. 3, showing the air distribution device within the cabinet.

As shown in FIGS. 1 and 3, the cabinet 10 has an internal chamber 20 that is defined by a side wall arrangement 22. The side wall arrangement 22 defines a perimeter Per.1 of the cabinet 10. The side wall arrangement 22 includes a front wall 24, a rear wall 26, a first side wall 28, and a second side wall 30. In a preferred embodiment, the front wall 24 and/or the rear wall 26 are doors that are hingeably connected to the cabinet 10 such that they can moved between open and closed positions to provide access to the internal chamber 20 of the cabinet 10. The front wall 24 includes an upper segment 32 and a lower segment 34 that is air permeable, meaning that air can pass through the segment 34 and enter the internal chamber 20. The lower segment 34 can be a grate, screen, or a panel with multiple openings. Regardless of the precise construction, the lower segment 34 is adapted to allow cool air to enter the cabinet 10. Alternatively, the entire front wall 24, including the upper and lower segments 32, 34, has a grate composition to ensure air permeability. Like the lower segment 34, the rear wall 26 has a grate composition. Thus, the rear wall 26 is configured to vent warm air from the cabinet 10.

The computer device support structure or rack 18 is positioned within the internal chamber 20 of the cabinet 10. The support structure 18 comprises multiple vertical posts or columns 36 that usually extend the height of the cabinet 10. Each post 36 has means for engaging 38 a portion of the computer device 12 to horizontally support the device 12. For example, the engaging means 38 is a collection of ledges and/or brackets that extend transverse to the post 36 to slidingly engage the computer device 12 as it is inserted into the support structure 18. Typically, the engaging means 38 are spaced along the posts 36 to define slots or bays wherein each slot receives a computer device 12. The four posts 36 define a perimeter Per.2 of the support structure 18, and preferably, the perimeter Per.2 of the support structure 18 is less than the perimeter Per.1 of the cabinet 10. As a result, there is a cavity or clearance C between the support structure 18 and the side wall arrangement 22 of the cabinet 10. Described in a different manner, there is a void between the posts 36 of the support structure 18 and the side wall arrangement 22 of the cabinet 10. Referring to FIG. 2, the cavity C has a generally rectangular configuration when viewed from above. Preferably, the cavity C extends substantially the height of the cabinet 10. One of skill in the art recognizes that the dimensions of the cavity C vary with the design parameters of the support structure 18 and the cabinet 10. In the cabinet 10, flexible cables or leads, including power cords, are positioned in the cavity C whereby the cavity C becomes a raceway for the cables.

The cabinet 10 includes a top wall 40 and a bottom wall 42. Preferably, the top and bottom walls 40, 42 are solid panels. Alternatively, the top wall 40 can include a ventilation fan (not shown) to further aid air flow throughout the cabinet 10. Similarly, the bottom wall 42 can include an opening(s) (not shown) to increase air flow into the cabinet 10. Although not shown, the cabinet 10 can include a leg assembly (not shown) that elevates the cabinet 10 a distance above the support surface or floor.

As shown in FIGS. 1-5, the internal air distribution device 14 includes an elongated duct 50, a plurality of discharge ports 62, an inlet fan 70, and a plenum 80. The duct 50 defines a passageway 52 for the distribution of air. The duct 50 is positioned substantially vertical within the cabinet 10, however, the duct 50 and the resulting passageway 52 can have an angular orientation within the cabinet 10. The duct 50 has a front wall 54, a rear wall 56, a first side wall 58, and a second side wall 60. The duct 50 also includes a top wall 57 and a bottom wall 59. In cross-section, the duct 50 has a generally rectangular configuration. Preferably, the duct 50 extends between the top wall 40 and the bottom wall 42 of the cabinet 10. Alternatively, an upper portion of the duct 50 is positioned below the top wall 40 of the cabinet 10, thereby creating a clearance there between. The duct 50 is generally a rigid structure formed from sheet metal or a similar metallic material; however, the duct 50 can be formed from a flexible material. Preferably, the duct 50 is positioned adjacent an inner surface of either the first or second side walls 28, 30; however, the duct 50 can be spaced from the inner surface. Alternatively, the duct 50 is integrally formed with the side wall 28, 30. In this manner, the side wall 28, 30 forms an extent of the passageway 52 and the duct is generally U-shaped when viewed in cross-section. In comparison, the duct 50 of FIGS. 1-5 is generally rectangular when viewed in cross-section. One of skill in the art recognizes that the configuration of the duct 50 can be altered depending upon the design parameters of the cabinet 10. For example, the duct 50 can be tubular with a circular or oval configuration in cross-section In another alternative, the dimensions of the side wall 28, 30 are reduced wherein the side wall 30 is connected to the duct 50 (and not the corners of the cabinet 10) to form the side wall arrangement 22.

The duct 50 of the internal air distribution device 14 includes at least one discharge port 62. The discharge ports 62 are in fluid communication with the passageway 52 of the duct 50 and are configured to transmit air from passageway 52 into the internal chamber 20. Referring to FIGS. 1-5, the discharge ports 62 are positioned in the second side wall 60; however, the ports 62 can be positioned in the rear wall 56 of the duct 50 or in both the second side wall 60 and the rear wall 56. When the ports 62 are positioned in the rear wall 56, air is distributed generally along the side walls 28, 30 of the cabinet 10. The discharge ports 62 are preferably adjustable nozzles 64 that can be selectively altered to control the volume and direction of the air flow. As shown in FIG. 6, the adjustable nozzle 64 includes a base portion 66 that is fixedly positioned in an opening in the second side wall 60 of the duct 50. The base portion 66 extends into the interior of the duct 50. The nozzle 64 further includes a central portion 67 that is moveable with respect to the base portion 66. The central portion 67 has an outlet opening or vent 68 through which air exits the nozzle 64. An exit flow path FP4 of the cool air is shown exiting the outlet opening 68 (see FIGS. 3 and 6). An adjustable damper or vane 69 is positioned within the central portion 67. The damper 69 can be adjusted to control the direction and/or quantity of air exiting the nozzle 64 via the outlet opening 68. Consequently, the direction and volume of the exit flow path FP4 can be varied by adjusting either the central portion 67 or the damper 69. Each nozzle 64 is selectively adjustable between a first position PI wherein the nozzle 64 is open to transmit air, and a second position P2 (not shown) wherein the nozzle 64 is closed and air transmission is precluded. In addition, the nozzle 64 is moveable to an intermediate position P3 (not shown) wherein the nozzle 64 transmits a reduced quantity of air. Thus, the nozzle 64 can be throttled or adjusted between the first, intermediate, and second positions to selectively control the flow air through the nozzle 64.

As shown in FIG. 1, the nozzles 64 are cooperatively positioned with the computer devices 12 in the support structure 18 to transmit air to a frontal portion 16 of the computer devices 12. Thus, the nozzles 64 are arrayed in a front portion 60a of the second side wall 60 of the duct 50 (see FIGS. 1, 2 and 5). The precise positioning of the nozzles 64 in the second side wall 60 can vary to accommodate different sized support structures 18 and computer devices 12. The nozzles 64 are positioned along an extent of the duct 50; however, the precise number and positioning of the nozzles 64 varies with the design parameters of the air distribution device 14 and the cabinet 10. In another embodiment, the nozzles 64 are omitted and the discharge port 62 comprises either a single slot 63 or series of slots 63 (see FIG. 2A). In this configuration, the slot 63 has an internal damper that can be adjusted to control the flow of air through the discharge port 62.

The inlet fan 70 is in fluid communication with the passageway 52 of the duct 50. The inlet fan 70 is configured to draw in air from a lower region of the internal chamber 20 of the cabinet 10. The inlet fan 70 is mounted in a duct housing 72 that is positioned adjacent to the vertical duct 50. Thus, the inlet fan 70, the housing 72, and the passageway 52 are in fluid communication. The inlet fan 70 has an opening 74 through which air is drawn and communicated to the passageway 52. An inlet flow path FP2 (see FIG. 3) represents the air that is drawn through the opening 74 towards the passageway 52. Due to the positioning of the inlet fan 70, the inlet flow path FP2 is transverse to the side walls 28, 30 of the cabinet 10. Alternatively, the inlet fan 70 is positioned such that the inlet flow path FP2 is transverse to the front and rear walls 24, 26 of the cabinet 10. Referring to FIGS. 1-6, the inlet fan 70 has an inlet axis that is parallel to a discharge axis of the nozzles 64, where the inlet axis is the axis of the inlet area and the discharge axis the is the axis of the discharge area. Alternatively, the inlet fan 70 is repositioned such that the inlet axis is generally perpendicular to the discharge axis of the nozzles 64.

Although the inlet fan 70 is shown as being positioned adjacent to the vertical duct 50, the inlet fan 70 can be incorporated into a lower segment of the duct 50. In this configuration, the inlet fan 70 is inline with the duct 50 and the passageway 52. In FIG. 1, the inlet fan 70 is shown positioned generally between a pair of vertical posts 36 of the support structure 18; however, the inlet fan 70 can be positioned beyond or external to the posts 36. For example, the inlet fan 70 can be positioned between a front post 36 and the front wall 24 of the side wall arrangement 22, or between a rear post 36 and the rear wall 26. The inlet fan 70 has a lead (not shown) for connection to a power source. The air distribution device 14 can include a programmable control panel to monitor and control the operation of the air distribution device 14, including the inlet fan 70. Preferably, the inlet fan 70 is a vane axial fan with a fractional horsepower motor. However, one of skill in the art recognizes that a number of different fans can be utilized as the inlet fan 70, such as a centrifugal fan.

Figure 5:
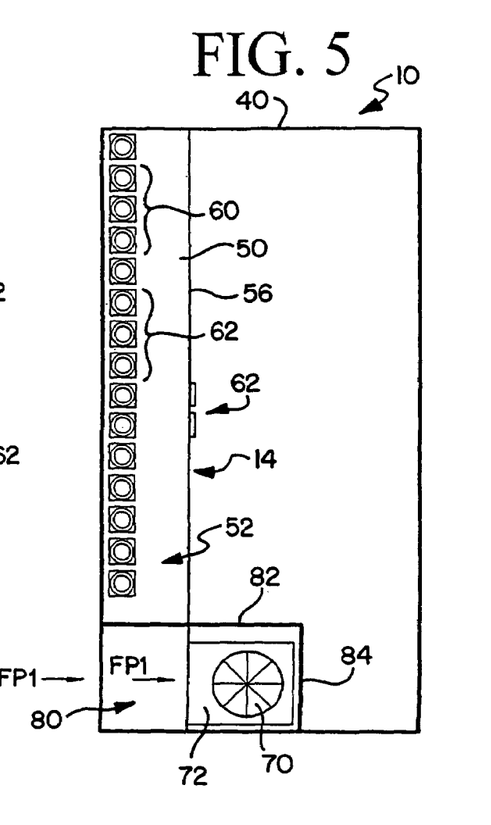
FIG. 5 is a side plan view of the cabinet of FIG. 1 taken along line 5-5 of FIG. 3, showing the air distribution device within the cabinet.
Figure 6:
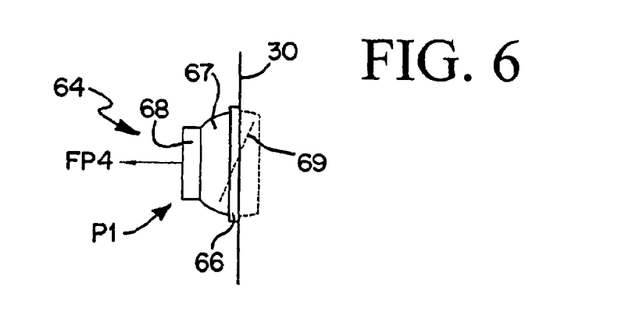
FIG. 6 is side plan view of a nozzle extending from a duct of the air distribution device of the cabinet of FIG. 1.

Referring to FIGS. 1, 3 and 5, the internal chamber 20 of the cabinet 10 includes a plenum 80, wherein the plenum 80 is a lower region of the internal chamber 20 from which air is drawn into the passageway 52 by the inlet fan 70. The plenum 80 is defined by a horizontal partition wall 82, a rear partition wall 84, the bottom wall 42 of the cabinet 10, and the lower segment 34 of the front wall 24. Preferably, the horizontal partition wall 82 is positioned below the adjustable nozzles 64. The rear partition wall 84 is spaced from the rear wall 26 of the side wall arrangement 22 to define a clearance. A lower portion of the vertical duct 50 is positioned within the plenum 80. Preferably, the inlet fan 70 is positioned entirely within the plenum 80. However, depending upon the design parameters of the inlet fan 70 and the plenum 80, an extent of the inlet fan 70 can extend beyond the plenum 80. Alternatively, the plenum 80 is positioned in an upper region of the internal chamber 20. In this configuration, an intermediate duct (not shown) is in fluid communication with the plenum, the inlet fan 70 and the passageway 52 of the duct 50.

As shown in FIGS. 1 and 3-5, the air distribution device 14 is positioned in the cavity C of the cabinet 10. This means that the air distribution device 14 is positioned substantially between the support structure 18 and the side wall arrangement 22 of the cabinet 10. Described in another manner, the air distribution device 14 is positioned beyond the perimeter Per.2 of the support structure 18 and within the perimeter Per.1 of the cabinet 10. As a result, the air distribution device 14 does not interfere with the operation of the computer devices 12 arrayed in the support structure 18. Also, the air distribution device 14 does not interfere with the operation of the cables, leads and/or power cords of the computer devices 12. Furthermore, the air distribution device 14 does not interfere with the opening or closing of the front and rear walls 24, 26, including the lower segment 34. Nor does the air distribution device 14 require the redesign or reconfiguration of the support structure 18. These factors enable the air distribution device 14 to be installed in a conventional computer cabinet having a support structure, whereby the air distribution device 14 becomes a retrofit application. As a result, the utility and commercial viability of the air distribution device 14 is increased.

As shown in FIG. 1, the cabinet 10 has a pair of air distribution devices 14 positioned within the internal chamber 20. One of skill in the art recognizes that the air distribution devices 14 have similar dimensions and configurations. One of skill further recognizes that the precise number of distribution devices 13 can vary with the design parameters of the cabinet 10. For example, the cabinet 10 has a single air distribution device 14, wherein the components, including the inlet fan 70, are sized to meet the cooling requirements of the computer devices 12 in the support structure 18.

In operation, the air distribution device 14 draws ambient air into the cabinet 10 and then distributes it to the frontal portion 16 of the computer devices 12 arrayed in the support structure 18. Because the discharge ports 62 are selectively adjustable, the air distribution device 14 can be tailored to distribute air to computer devices 12 in a precise and highly controlled manner. One of skill in the art understands that the computer devices 12 generate a considerable amount of heat during operation. Since excessive heat can lead to component failure, a conventional computer device 12 includes an internal cooling fan that draws cool air into the device and across the internal components and then discharges warm air from the device 12. The air distribution device 14 delivers a uniform flow of air to the frontal portion 16 of the computer devices 12 positioned in the support rack 18. By providing a uniform flow of air to the computer devices 12, meaning along the height of the support structure 18, the temperature gradient in the internal chamber 20 is reduced. Additionally, the amount of heat transferred by the multiple devices 12 is increased and the amount of heat that remains within the internal chamber 20 of the cabinet 10 is reduced.

In more specific terms and referring to FIGS. 3-6, a quantity of air, represented as inlet flow path FP1, is drawn through the lower segment 34 of the front wall 24 and into the plenum 42 by the inlet fan 70. The inlet fan 70 then draws air from the plenum 42 through the fan 70, which is represented as flow path FP2. Next, air is drawn into the passageway 52 of the duct 50, as represented by flow path FP3. From there, the air of flow path FP3 migrates through the passageway 52 to the various nozzles 64. Once the air of flow path FP3 reaches the nozzles 64, it is discharged through the nozzles 64 as flow path FP4 into the internal chamber 20 of the cabinet 10. Due to the positioning of the air distribution device 14 and the computer devices 12 within the internal chamber 20, the discharged air of flow path FP4 is directed towards the front portion 16 of the computer devices 12. There, the internal cooling fan of the device 12 draws air through the front portion 16 of device 12 to cool the internal components and then discharges the warm air through a port in a rear portion of the device 12. The warm air that is discharged by the computer devices 12 exits the cabinet 10 by passing through the permeable rear wall 26. Therefore, with the selectively adjustable nozzles 64, the air distribution device 14 precisely delivers air to the computer devices 12 which enables uniform cooling of the devices 12 and thereby decreases both the internal temperature of the devices 12 and the temperature of the air being discharged through the cabinet 10.

Since the nozzles 64 are selectively adjustable between an open position P1, a closed position P2, and an intermediate position P3, the air distribution device 14 can be tailored to deliver cool air to the specific number and location of the computer devices 12 in the support structure 18. For example, when the support structure 18 contains a large number of computer devices 12, the air distribution device 14 delivers air to all devices 12. This means that all nozzles 64 are open and discharging air in a generally horizontal flow path FP4 (see FIG. 3) to the front portion 16 of the computer devices 12. In another example, a reduced number of computer devices 12 are supported by the structure 18 and the air distribution device 14 is adjusted to deliver air to the reduced number of devices 12. This means that the nozzle 64 proximate a device 12 delivers air in a generally horizontal flow path FP4, and the various nozzles 64 near the device 12 are adjusted to direct air in a generally angular flow path FP4. In yet another example, a single computer device 12 is positioned at a midpoint of the support structure 18. To efficiently deliver air to that device 12, the air distribution device 14 is adjusted in the following manner: the nozzle 64 proximate the device 12 delivers air in a generally horizontal flow path FP4 to the front portion 16 of the device; the nozzles 64 near, meaning above and below, the device 12 are adjusted to direct cool air in a generally angular flow path FP4 to the front portion 16; and, the nozzles 64 positioned a distance from the device 12 are adjusted to a closed position P2. Therefore, the adjustable nozzles 64 enable the air distribution device 14 to deliver a significant quantity of air to the front portion 16 of the computer devices 12 in a precise and selective manner, which enables the computer devices 12 to discharge an increased quantity of heat. Accordingly, the adjustable nozzles 64 increase the efficiency of the air distribution device 14 and reduce the quantity of heat that accumulates in the cabinet 10 during operation of the computer devices 12. Described in a different manner, the adjustable nozzles 64 enable the air distribution device 14 to reduce the temperature gradient explained above.

FIGS. 7-11 disclose an alternate embodiment of the cabinet of the present invention, generally designated with the reference numeral 110. The cabinet 110 has an internal chamber 120 that accommodates two distinct support structures 118a,b for the computer devices 12. Compared to the cabinet 10, the cabinet 110 has an enlarged configuration that enables the cabinet 110 to house a greater number of computer devices 12. The cabinet 110 has a pair of front doors 124a,b (the front door 124b has been removed for illustration purposes) one of the and a pair of rear doors 126a,b. One of skill in the art recognizes that the dimensions of the top wall 140 and the bottom wall 142 of the cabinet 110 are increased to accommodate the larger internal chamber 120.

Figure 7:
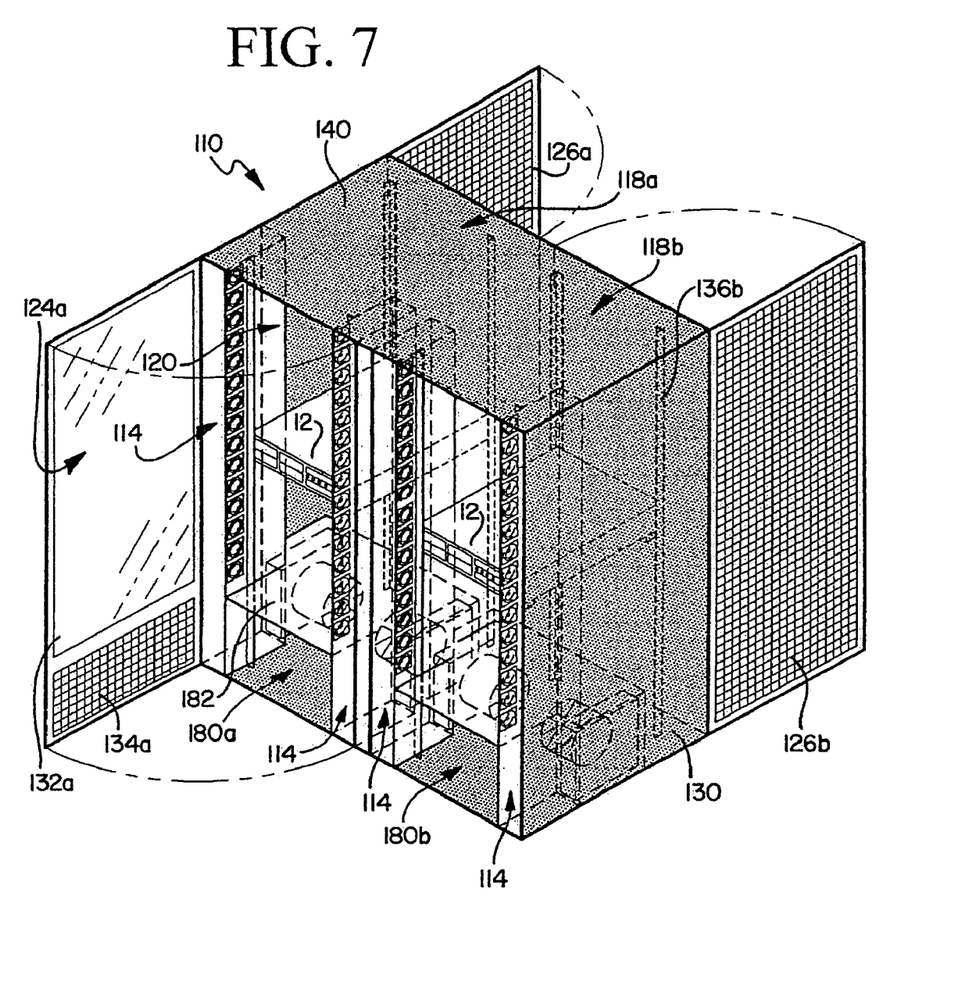
FIG. 7 is a perspective view of an alternate cabinet of the present invention, showing an enlarged cabinet having a pair of internal chambers with multiple air distribution devices.
Figure 8:
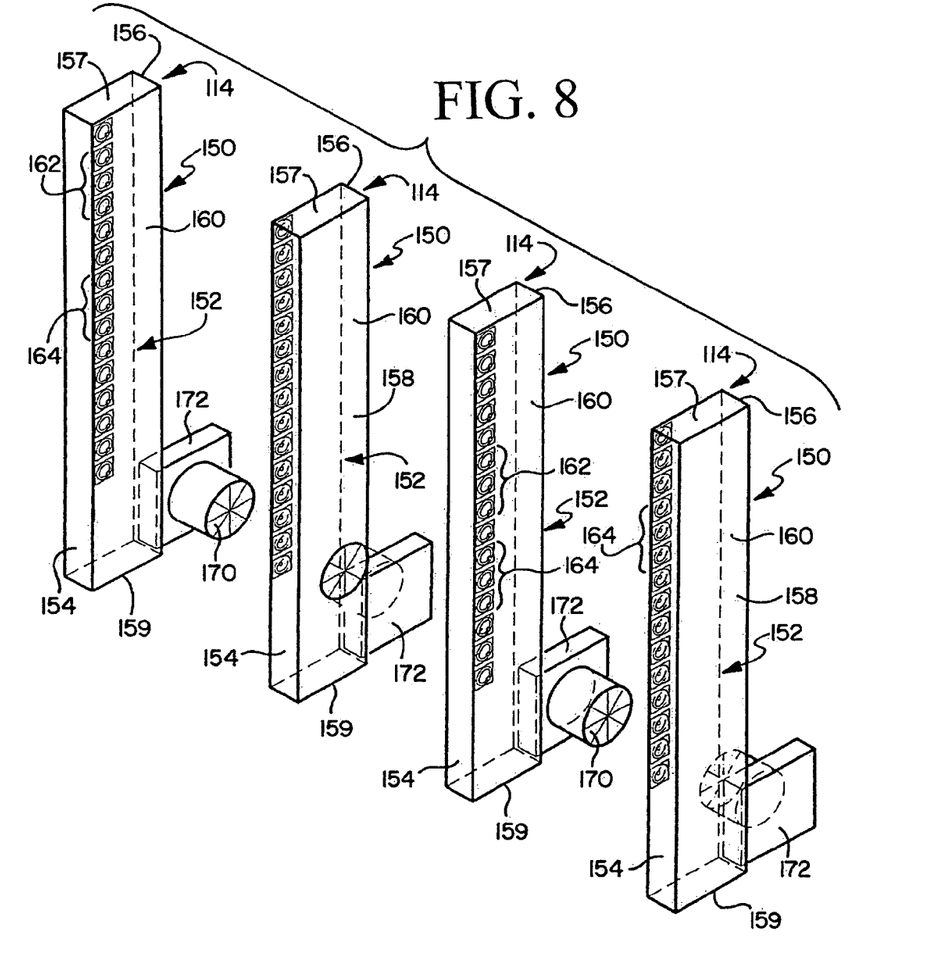
FIG. 8 is a perspective view of the present invention of FIG. 7, showing the air distribution devices removed from the cabinet.
Figure 9:
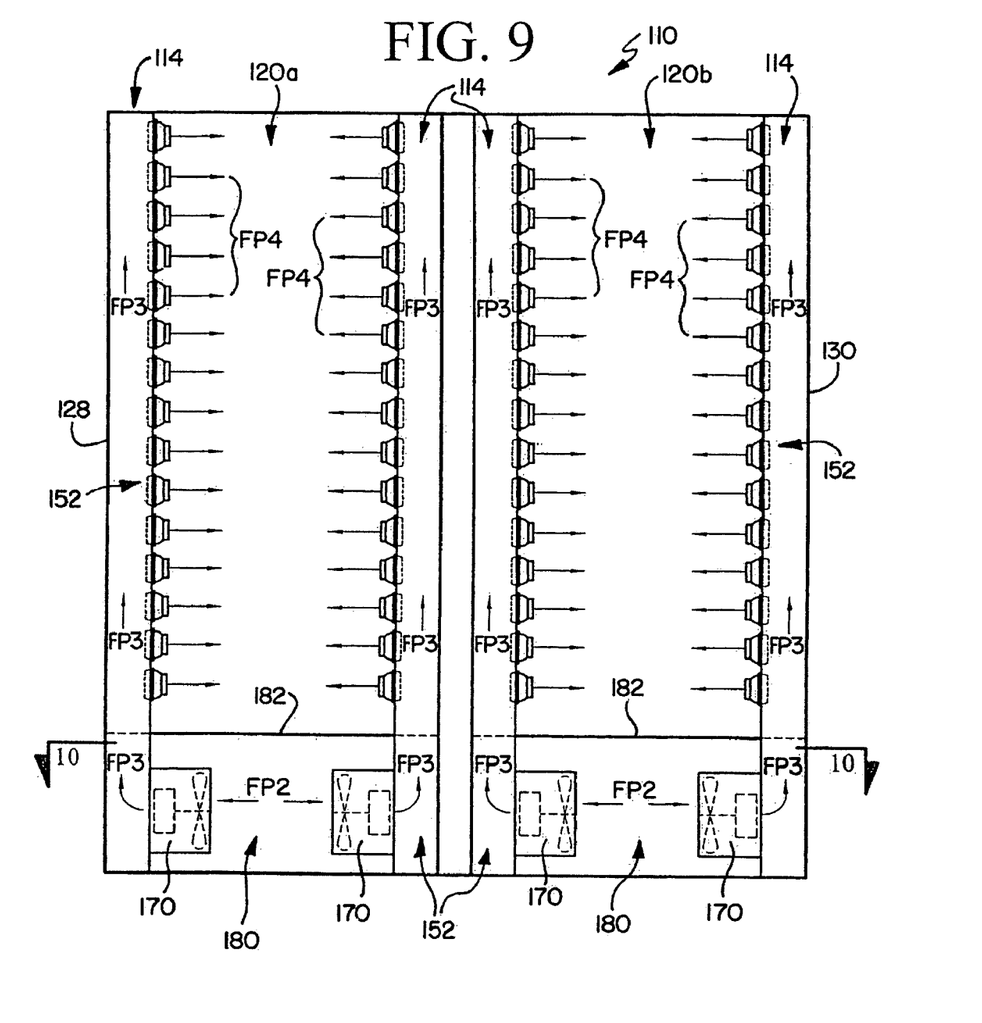
FIG. 9 is a front plan view of the cabinet of FIG. 7, showing two air distribution devices and a front wall of each cabinet being removed.
Figure 10:
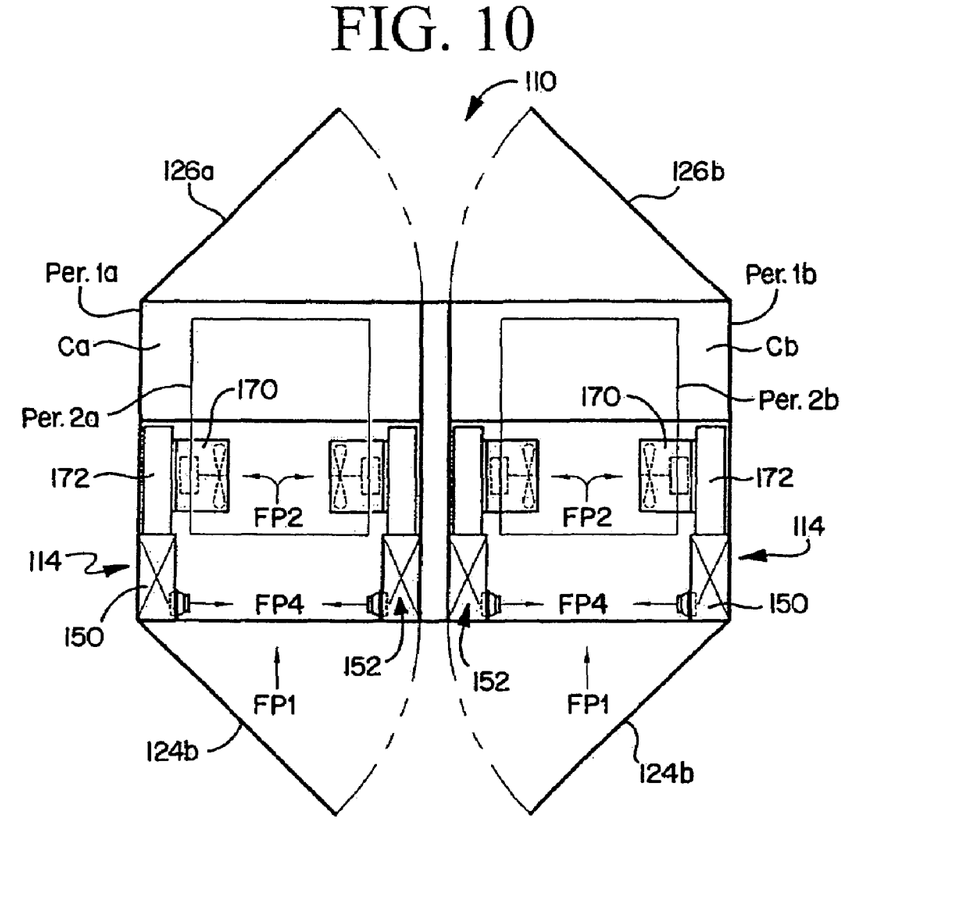
FIG. 10 is a top plan view of the double cabinet of FIG. 7 taken along line 10-10 of FIG. 9, showing the air distribution devices within the cabinet; and, FIG. 11 is a is a perspective view of an alternate cabinet of the present invention, showing an internal air distribution device and a support structure for a computer device.

As shown in FIG. 7, the cabinet 110 includes four air distribution devices 114; however, it can have a greater or lesser number of devices 114. For example, a first portion 120a (coinciding with the first support structure 118a) of the internal chamber 120 has two air distribution devices 114 and a second portion 120b (coinciding with the second support structure 118b) of the internal chamber 120 has a single air distribution device 114 that meets the cooling requirements of the cabinet 110. Due to the positioning of the air distribution devices 114, there is a gap 129 between the air distribution devices 114. However, the gap 129 can be eliminated in a number of ways, including by increasing the dimensions of the distribution devices 114 or altering the positioning of the devices 114.

Figure 11:
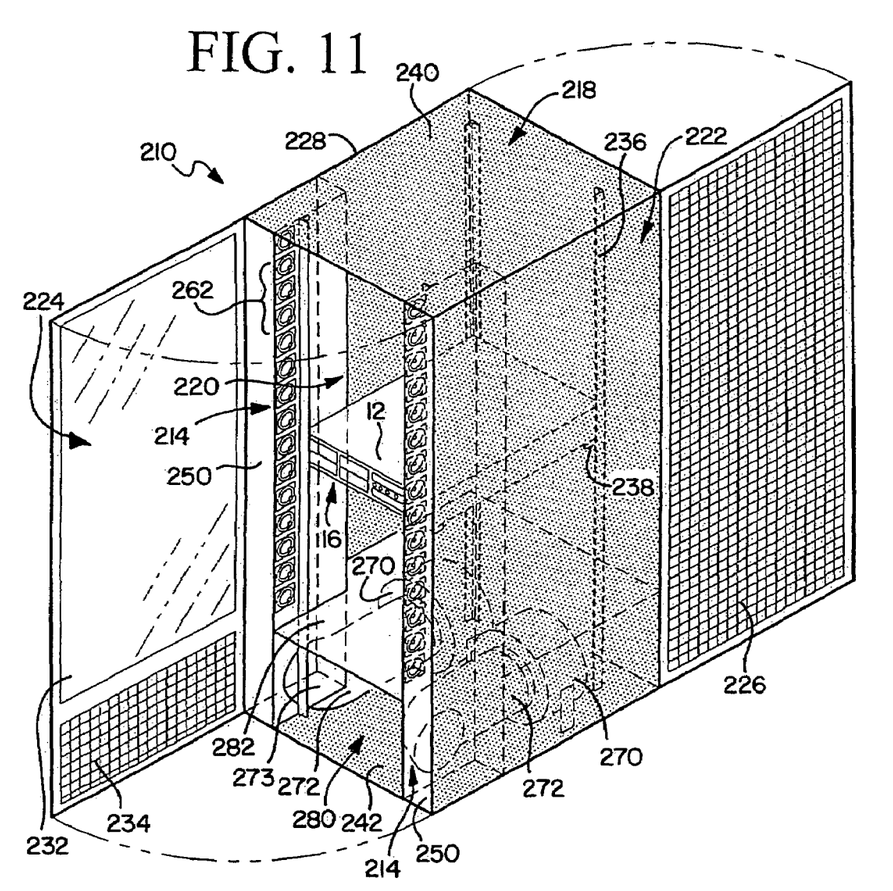

FIG. 11 discloses an alternate embodiment of the cabinet of the present invention, generally designated with the reference numeral 210. The cabinet 210 has at least one air distribution device 214 that includes an elongated horizontal duct 272 that houses the inlet fan 270. The horizontal duct 272 has an elbow 273 that permits the duct 272 to port with the second side wall 260 of the vertical duct 250 such that the horizontal duct 272 is in fluid communication with the passageway 252 of the vertical duct 250. Alternatively, the elbow 273 is omitted and the horizontal duct 272 ports with the rear wall 256 of the vertical duct 250. The inlet fan 270 is oriented in the plenum 280 such that the inlet flow path FP through the opening 274 of the fan 270 is generally transverse to the front and rear walls 224, 226 of the cabinet 210. Described in a different manner, the inlet flow path FP through the opening 274 of the fan 270 is generally parallel to the side walls 228, 230 of the cabinet 210. Compared to the cabinet 10 shown in FIG. 1, the inlet point of the inlet fan 270, meaning the location where cool air is drawn into the inlet fan, is closer to the rear wall 226.

The present invention further provides a method of distributing air to an arrangement of computer devices 12 within the cabinet 10 involves a number of steps. As explained above, the cabinet 10 includes the support structure 18 and the air distribution device 14. Ambient room air is drawn into the plenum 80 through the permeable lower segment 34 of the front door 24 by the inlet fan 70. Due to the inlet fan 70, the air is then transmitted to the passageway 52 of the duct 50. Next, the air is discharged from the passageway 52 through the discharge ports 62 and uniformly distributed to the frontal portion 16 of the computer devices 12. The nozzles 64 enable the air distribution device 14 to selectively distribute air in a precise manner. As a result, when the support structure 18 is not fully loaded with computer devices 12, the nozzles 64 can be adjusted such that the air distribution device 14 selectively and precisely delivers air to cool the computer devices.

While the specific embodiment has been illustrated and described, numerous modifications come to mind without significantly departing from the spirit of the invention, and the scope of protection is only limited by the scope of the accompanying claims.

What is claimed is:

1. A cabinet housing computer devices, the cabinet comprising:
    an internal chamber defined by a front door, a rear door, a first side wall and a second side wall;
    an assembly of vertical members extending upward from a bottom wall of the chamber to define a device rack, the device rack positioned within the internal chamber, the device rack having a perimeter that is less than a perimeter of the internal chamber whereby a front cavity is formed between the front door and a front portion of the device rack;
    a first vertical duct positioned between the device rack and the first side wall, the first duct having an outer wall adjacent an inner surface of the first side wall and a front wall adjacent the front door, the first duct having means for discharging air from the first vertical duct towards the device rack, the discharge means residing in the front cavity and forward of the front portion of the device rack;
    a second vertical duct positioned between the device rack and the second side wall, the second duct having an outer wall adjacent an inner surface of the second side wall and a front wall adjacent the front door, the second duct having means for discharging air from the second vertical duct towards the device rack, the discharge means residing in the front cavity and forward of the front portion of the device rack;
    a plenum formed by a wall arrangement including a solid rear wall and an upper wall, the upper wall extending rearward from the front door past the front portion of the device rack and into an intermediate portion of the device rack; and,
    a first inlet fan in fluid communication with the first and second vertical ducts, wherein the inlet fan draws cooling air from a source external to the chamber into the plenum for distribution to the first and second vertical ducts during operation.

2. The cabinet of claim 1 wherein the discharge means of the first duct is an elongated slot in an internal side wall of the first duct, and the discharge means of the second duct is an elongated slot in an internal side wall of the second duct.

3. The cabinet of claim 2 wherein the discharge means of the first and second ducts further comprise an elongated slot in each rear wall of the duct, the slot in the internal side wall of the duct forming a first flow path that directs air to the front portion of the device rack and the slot in the rear wall of the duct forming a second flow path that directs air towards the side portion of the device rack.

4. The cabinet of claim 1 wherein the discharge means of the first duct is an array of ports positioned along an internal side wall of the first duct, and the discharge means of the second duct is an array of ports positioned along an internal side wall of the second duct.

5. The cabinet of claim 4 wherein the discharge means of the first and second ducts further comprise at least one port in each rear wall of the duct, wherein the ports in the internal side wall of the duct forms a first flow path that directs air to the front portion of the device rack and the port in the rear wall of the duct forms a second flow path that directs air towards the side portion of the device rack.

6. The cabinet of claim 1 further comprising a second inlet fan in fluid communication with the second vertical duct and wherein the first inlet fan is in fluid communication with the first vertical duct, the first and second inlet fans being in an opposed positional relationship at a bottom portion of the cabinet.

7. The cabinet of claim 1 wherein the rear wall of the plenum is positioned in the intermediate portion of the device rack and forward of a rear edge of the rack.

8. The cabinet of claim 1 wherein the front door of the chamber has a lower permeable segment, and wherein inlet fan draws cooling air through the permeable segment into the plenum.

9. The cabinet of claim 1 wherein the bottom wall of the chamber has a permeable segment, and wherein the inlet fan draws air into the plenum through the permeable segment in the bottom wall.

10. A method of distributing air to computer devices stacked within a cabinet, the method comprising the following steps:
providing a cabinet with an internal rack and computer devices supported by the rack, the cabinet having a wall arrangement with both a permeable inlet wall segment and a permeable outlet wall segment;
providing a substantially vertical duct positioned between the cabinet and the rack, the duct defining a passageway for air distribution wherein the passageway is in fluid communication with at least one discharge port and an inlet fan, the discharge port positioned forward of a front portion of the rack and the computer devices;
providing a plenum within a lower portion of the rack, wherein the inlet fan resides within the plenum;
activating the inlet fan to draw a quantity of air from an external source through the permeable inlet wall segment into the plenum;
transmitting the air from the inlet fan to the passageway of the duct;
distributing the air through the passageway and the discharge port to a front portion of the rack and the computer devices supported thereby, wherein the computer devices intake the air and discharge the air at a rear portion of the devices; and,
expelling air discharged from the computer devices through the permeable outlet wall segment.

11. A cabinet housing computer devices, the cabinet comprising:
an internal chamber defined by an openable front door, a rear door, a pair of opposed side walls;
an assembly of vertical members extending upward from a bottom wall of the chamber, the vertical members defining a device rack that is positioned within the internal chamber;
a vertical duct positioned between the device rack and one of the cabinet side walls, the vertical duct having each of the following
 a) an external side wall that is positioned adjacent an inner surface of the side wall,
 b) a front wall positioned adjacent the front door,
 c) an internal side wall with at least one primary discharge port positioned forward of a front edge of the device rack wherein the discharge port forms a first flow path that directs air to the front portion of the device rack, and
 d) a rear wall with at least one secondary discharge port positioned rearward of the front edge of the device rack wherein the secondary discharge port forms a second flow path that directs air towards a side portion of the device rack;
a plenum positioned within a lower portion of the internal chamber, the plenum formed by a wall arrangement including a rear wall that intersects an upper wall, wherein the rear wall extends upward from a bottom wall of the cabinet, and wherein the upper wall extends rearward from the front door past the front edge of the device rack and into an intermediate portion of the device rack; and,
an inlet fan in fluid communication with the vertical duct and being positioned rearward of the front edge of the device rack, wherein the inlet fan draws cooling air into the plenum for distribution to the first vertical duct and then discharge through the discharge ports as the first and second flow paths.

12. The cabinet housing computer devices of claim 11, wherein the inlet fan has an inlet axis that is parallel to the discharge axis of the primary discharge port.

13. The cabinet housing computer devices of claim 11, wherein the rear wall of the vertical duct is positioned forward of a rear edge of the device rack.

14. The cabinet housing computer devices of claim 11, wherein the front door has a lower permeable segment through which the inlet fan draws cooling air into the plenum.

15. The cabinet housing computer devices of claim 14, wherein the rear door has a permeable segment, and wherein air discharged from the computer devices is expelled through the permeable segment of the rear door.

16. The cabinet housing computer devices of claim 11, wherein the rear wall of the plenum is positioned both forward of the rear edge of the device rack and rearward of the inlet fan.

17. A cabinet housing computer devices with an internal air distribution device that delivers cooling air to the devices, the cabinet comprising:
an internal chamber defined by a front door, a rear door, a first side wall and a second side wall, wherein the doors and the side walls collectively define a chamber perimeter;
a device support rack defined by an assembly of elongated vertical members that extend upward from a floor of the chamber, wherein the vertical members collectively define a support rack perimeter that is less than the chamber perimeter, and wherein the support rack is positioned within the chamber and a cavity is formed between the support rack perimeter and the chamber perimeter;

a vertical duct positioned within the cavity and between the device rack and the first side wall, the duct having an outer wall adjacent an inner surface of the first side wall and a front wall adjacent the front door, the duct further having an inner wall with at least one discharge port that forms a first flow path directs air to a front edge of the support rack perimeter, and wherein the discharge port resides in a front segment of the cavity and forward of the front edge of the support rack perimeter;

a plenum positioned in a lower portion of the chamber, the plenum formed by a wall arrangement including a rear wall that intersects an upper wall, wherein the rear wall extends upward from the floor of the chamber, and wherein the upper wall extends from the front door rearward past the front edge of the support rack perimeter and into an intermediate portion of the device rack; and, an inlet fan in fluid communication with the vertical duct, wherein the inlet fan draws cooling air from a source external to the chamber into the plenum for distribution to the first duct during operation.

18. The cabinet housing computer devices of claim 17, wherein the cavity consists of the front segment, a rear segment, a first side segment and a second side segment.

19. The cabinet housing computer devices of claim 17, wherein the vertical duct has a rear wall with at least one auxiliary discharge port that forms a second flow path that directs air towards the rear door of the chamber.

20. The cabinet housing computer devices of claim 17, wherein a rear wall of the vertical duct is positioned between the front edge of and a rear edge of the support rack perimeter.

21. The cabinet housing computer devices of claim 17, wherein the rear wall of the plenum is positioned both forward of the rear edge of the support rack perimeter and rearward of the inlet fan.

22. The cabinet housing computer devices of claim 17, wherein the rear door has a permeable segment, and wherein air discharged from the computer devices is expelled through the permeable segment of the rear door.

23. The cabinet housing computer devices of claim 17, wherein the front door has a lower permeable segment through which the inlet fan draws cooling air into the plenum, the lower permeable segment being aligned with the plenum.

24. The cabinet housing computer devices of claim 17, wherein the inlet fan as an inlet axis that is parallel to the discharge axis of the discharge port.

25. The cabinet housing computer devices of claim 17, wherein the inlet fan is positioned on the chamber floor and at a base of the vertical duct.

\* \* \* \* \*